(12) United States Patent
Liaw (10) Patent No.: US 8,486,840 B2
(45) Date of Patent: Jul. 16, 2013

(54) INVERSE SPACER PROCESSING

(75) Inventor: Jhon Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/294,340

(22) Filed: Nov. 11, 2011

(65) Prior Publication Data
US 2013/0122709 A1    May 16, 2013

(51) Int. Cl.
*H01L 21/311* (2006.01)

(52) U.S. Cl.
USPC ............. 438/702; 216/2; 216/41; 216/46; 257/E21.039; 257/E21.232; 257/E21.236; 257/E21.24; 430/313; 438/299; 438/448; 438/587; 438/689; 438/723; 438/724; 438/725

(58) Field of Classification Search
USPC .......... 216/2, 41, 46; 257/E21.039, E21.232, 257/E21.236, E21.24; 438/299, 448, 587, 438/689, 702, 723, 724, 725
See application file for complete search history.

(56) References Cited

U.S. PATENT DOCUMENTS

| 7,718,529 B2 | 5/2010 | Deng et al. | |
| 2006/0281266 A1* | 12/2006 | Wells | 438/299 |

* cited by examiner

*Primary Examiner* — Asok K Sarkar
(74) *Attorney, Agent, or Firm* — Haynes and Boone, LLP (57) ABSTRACT

A method includes making a target feature of an integrated circuit by providing a main layer over a substrate, depositing a first mask layer over the main layer, patterning the first mask layer, forming sidewall spacers with a width (w) in adjoining sidewalls of the patterned first mask layer and exposing a top area of the patterned first mask layer, selectively removing the first mask layer and exposing a portion of the main layer between the sidewall spacers, depositing a second mask layer over the main layer between the sidewall spacers, selectively removing the sidewall spacers to form an opening and exposing another portion of the main layer in the opening, etching the main layer through the opening to form the target feature.

22 Claims, 10 Drawing Sheets

INVERSE SPACER PROCESSING

BACKGROUND

The semiconductor industry has experienced exponential growth. Continuous advancements in lithographic resolution have paced uninterruptedly to support critical dimensions (CDs) of 90 nm to 65 nm, 45 nm, 32 nm, 22 nm, 16 nm and beyond. New techniques in lithography have been developed, such as immersion lithography, multiple patterning, extreme ultraviolet (EUV) lithography and e-beam lithography. The challenges being raised by new lithography techniques are not only in resolution but also in economy (e.g. cost of upgrading and loss of throughput). A lot of developments have focused on extending existing lithography techniques to the next technology generation. However, current methods have not been satisfactory in all respects. For example, process window of CD uniformity control and process flexibility of forming special features may not sufficient.

SUMMARY

The present disclosure provides many different embodiments of a method of making an integrated circuit by using the inverse spacer lithography, and the corresponding device. In one embodiment, the method includes making a target feature of the integrated circuit by providing a main layer over a substrate, depositing a first mask layer over the main layer, patterning the first mask layer, forming sidewall spacers with a width (w) in adjoining sidewalls of the patterned first mask layer and exposing a top area of the patterned first mask layer, selectively removing the first mask layer and exposing a portion of the main layer between the sidewall spacers, depositing a second hard mask layer over the main layer between the sidewall spacers, selectively removing the sidewall spacers to form an opening and exposing another portion of the main layer in the opening, etching the main layer through the opening to form the target feature.

In another embodiment, the method includes providing a main layer over a substrate, depositing a dummy layer over the main layer, and depositing a first hard layer mask over the dummy layer. The first hard mask layer is patterned and sidewall spacers with a width (w) are formed on the patterned first hard mask layer. The patterned first hard mask layer is removed and a second hard mask layer is deposited between the sidewall spacers. The method further includes removing the sidewall spacers to form an upper portion of an opening to expose the dummy layer and etching the dummy layer through the upper portion of the opening to form a lower portion of the opening, thereby exposing the main layer in the opening. The main layer is etched through the opening to form a target feature.

In another embodiment, the method includes providing a main layer over a substrate, depositing a dummy layer over the main layer, and depositing a first hard layer mask over the dummy layer. The first hard mask layer is patterned with a vertical profile and sidewall spacers are formed with a width (w) on the patterned first hard mask layer. The patterned first hard mask layer is removed to expose a portion of the main layer between the sidewall spacers and a second hard mask layer is deposited on the exposed main layer between the sidewall spacers. The method further includes removing the sidewall spacers to form an upper portion of an opening to expose the dummy layer and etching the dummy layer through the upper portion of the opening to form a low portion of the opening, thereby exposing the main layer in the opening. The upper portion of the opening is removed by selectively etch of the second hard mask layer, and the main layer is etched through the remaining lower portion of the opening to form a target feature with a CD similar to the width of the sidewall spacer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
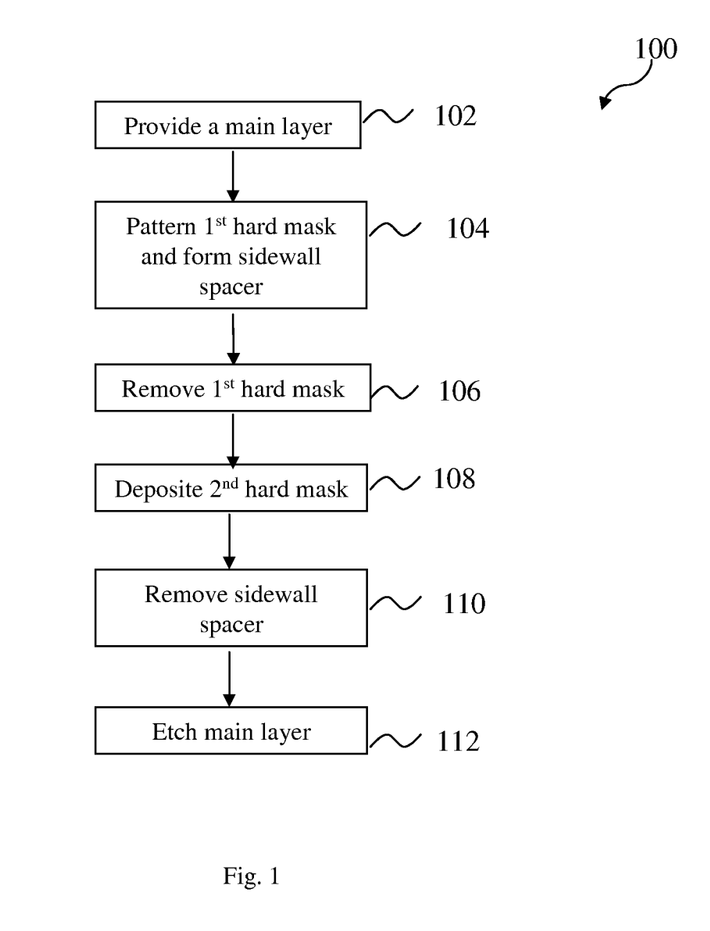
FIG. 1 is a flowchart of an example method of inverse spacer lithography constructed according to various aspects of the present disclosure.

FIG. 1 is a flowchart of one example embodiment of a method 100 of an inverse spacer lithography scheme constructed according to various aspects of the present disclosure. The method 100 is described with reference to FIGS. 2 through 6. When a critical dimension (CD) of a target feature is approaching or beyond the patterning limitation of an existing lithography tool, the method 100 of inverse spacer lithography helps to form the target feature with the existing lithography tools.

Figure 2:
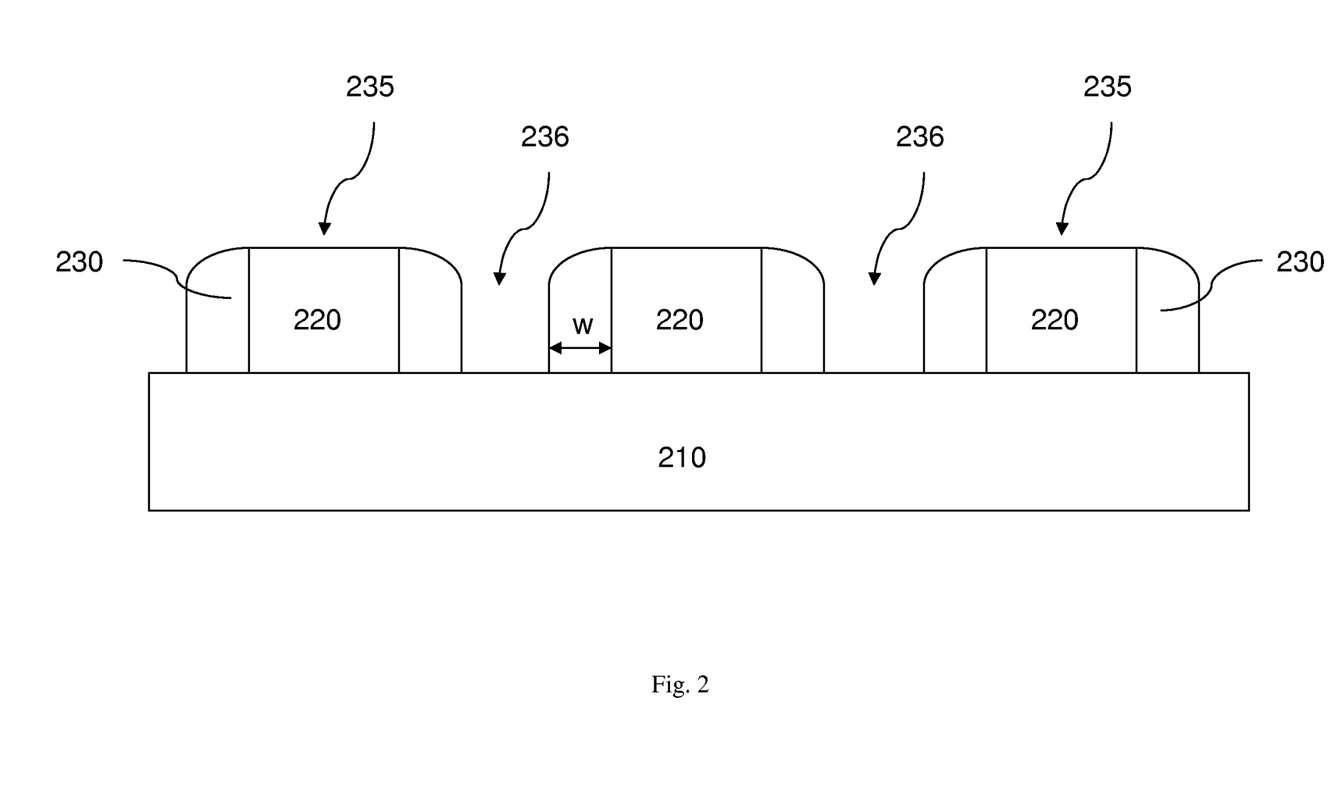
FIGS. 2 to 6 are cross-sectional views of an example embodiment of method of the inverse spacer lithography at fabrication stages constructed according to various aspects of the present disclosure.

Referring to FIGS. 1 and 2, the method 100 begins at step 102 by providing a main layer 210 on a substrate, such as a semiconductor wafer. The main layer 210 may include silicon oxide ($SiO_2$), silicon nitride ($Si_3N_4$), silicon oxynitride (SiON), a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. The main layer 210 may be formed by chemical vapor deposition (CVD), high density plasma CVD, spin-on methods, sputtering, and/or other suitable methods. In the depicted embodiment, the main layer 210 includes a low-k dielectric formed by CVD technique. The low-k dielectric material is selected from the group consisting of fluorine content, carbon content, air content and porous structure. It has a k constant below 3. In one embodiment, additionally, a post deposition thermal process may imply to improve mechanical properties of the low-k dielectric.

The method 100 proceeds to step 104 by patterning a first hard mask layer 220 and forming a sidewall spacer 230 on sidewalls of the first hard mask layer 220, as shown in FIG. 2. The first hard mask layer 220 may include $SiO_2$, $Si_3N_4$, SiON, TEOS, high-k materials, BPSG, FSG, PSG, BSG, and/or other suitable materials. The first hard mask layer 220 may be formed by CVD, high density plasma CVD, spin-on methods, sputtering, and/or other suitable methods.

The first hard mask layer 220 is desired to have a high etch selectivity with respect to the sidewall spacer 230 during a subsequent etch process. An etch selectivity describes an etch rate ratio between two different materials being etched. A desired etch selectivity may depend on several factors, such as type of films being etched, etching mechanisms, or etching conditions. In the depicted embodiment, the first hard mask layer 220 includes $SiO_2$ formed by a CVD technique.

The first hard mask layer 220 is patterned by a lithography technique, in a conventional manner. The patterned first hard mask layer 220 is etched to form a relatively vertical profile. The etching process may include an anisotropic dry etch with an adequate etch selectivity with respect to the main layer 210 to minimize a loss of the main layer 210 during the etching process. In the depicted embodiment, the first hard mask 220 is etched by a plasma etch equipped with $CF_4$ and $CHF_3$ gases.

Continuing with FIG. 2, the sidewall spacer 230 is formed on the sidewall of the patterned first hard mask layer 220. The sidewall spacer 230 may be formed by known deposition and spacer etching (anisotropic etching technique) techniques. The sidewall spacer 230 may include a dielectric material such as $SiO_2$, $Si_3N_4$, silicon carbide (SiC), SiON, a high-k dielectric, a low-k dielectric or combinations thereof. The material of the sidewall spacer 230 may be chosen to be etched faster with respect to the first hard mask layer 220 during a subsequent spacer etch.

In one embodiment, the material of the sidewall spacer 230 includes $Si_3N_4$ formed by a CVD technique. In another embodiment, the first hard mask 220 includes a CVD $Si_3N_4$ and the sidewall spacer 230 includes a CVD $SiO_2$. Alternatively, the main layer 210 may have same materials as the sidewall spacer 230, such as $SiO_2$ or a low-k dielectric, and the first mask 220 may include $Si_3N_4$. A spacer etching process is applied to form the sidewall spacer 230 on sidewalls of the first hard mask layer 220. The spacer etching exposes the top area of the patterned first hard mask layer 220, referring to as areas 235. The spacer etching also exposes a portion of the main layer 210, referring to as areas 236, as shown in FIG. 2. The spacer etching may include anisotropic dry etch with an adequate low selectivity with respect to the main layer 210 and the first hard mask layer 220.

The mechanism of etching in each dry-etch process may have a physical basis (e.g. glow-discharge sputtering, or ion milling) or a chemical basis (e.g., in pure plasma etching) or a combination of both (e.g., reactive ion etching or RIE). Sputtering relies on the directional nature of the incident energetic ions to etch in a highly anisotropic manner. Pure plasma etching or a chemical basis etching may achieve a very high selectivity against both mask material and underlying layers and typically etches in an isotropic fashion. Combining both physical and chemical mechanism etching offers a controlled anisotropic etch with adequate selectivity. In one embodiment, the spacer etching includes a plasma etch containing $CF_4$ and $CH_2F_2$ gases.

With continued reference to FIG. 2, a width (w) of the sidewall spacer 230 is defined by the spacer etching. The width (w) of the sidewall spacer 230 is used to define the CD of the target feature (not shown) in a future process, which will be described later. The width (w) of the sidewall spacer 230 may be controlled by process conditions such as deposition thickness of the sidewall spacer, sidewall spacer etch type, etch rate, etch depth, etch pressure or a combination thereof. In the depicted embodiment, the width (w) is around from 2 nm to 30 nm.

Figure 3A:
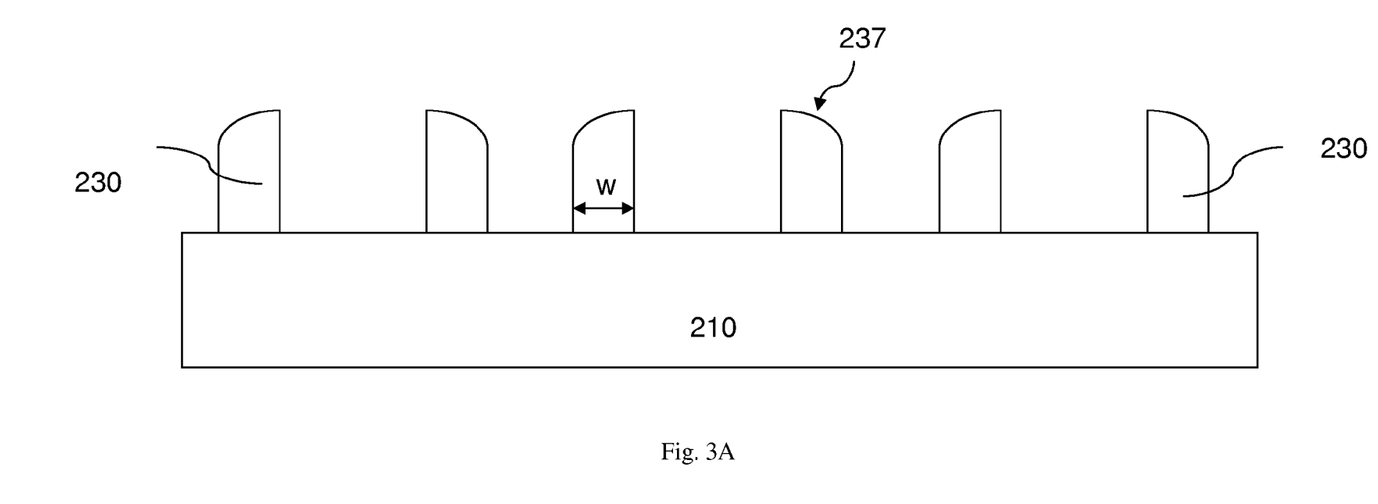
Figure 3B:
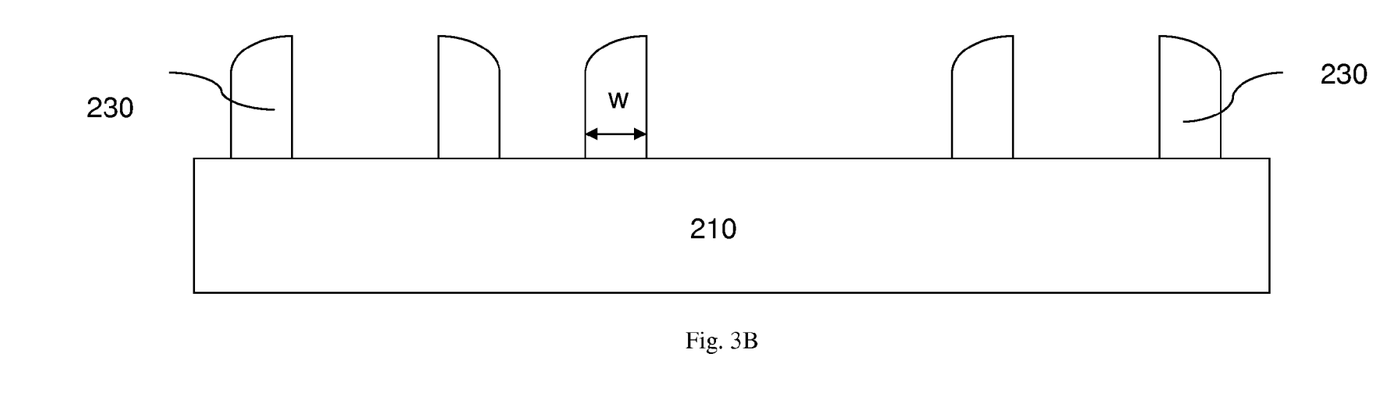

The method 100 proceeds to step 106 by removing the first hard mask layer 220, as shown in FIGS. 3A and 3B. The removing process is a selective etching process. It removes the first hard mask layer 220 to exposes the main layer 210 between the sidewall spacer 230. The present process step of removing the first hard mask 220 provides a fairly uniform pre-deposition condition and topography for a subsequent deposition process. A uniform pre-deposition condition and topography demonstrated thickness uniformity improvement and loading effect reduction in the subsequent deposition process. It also provides a wider process control window and larger process flexibility for the subsequent deposition process. During the selectively etching process of removing the first hard mask 220, the sidewall spacer 230 and the main layer 210 remain fairly intact. The selective etching process may include a wet etch, a dry etch or a combination thereof. As an example of the depicted embodiment, the selective etching process includes a dry etch equipped with fluorine-containing gases, such as $CF_4$, $CH_2F_2$ or $CHF_3$.

In another embodiment, an additional patterning process is used to remove a predetermined sidewall spacer 237, as shown in FIGS. 3A and 3B. Since the sidewall spacer 230 is formed in pairs (formed at both side of the first hard mask layer 220), it results in forming the target features 255 in pairs. When a non-pair target feature 255 is desired in associated locations, such as a line-end feature or a line-turning feature, the additional patterning process provides a method to form a non-pair target feature 255 (see FIG. 6) by removing the predetermined sidewall spacer 237 in those associated locations. The additional patterning process includes lithography, etching and strip resist processes, in a conventional manner.

Figure 4:
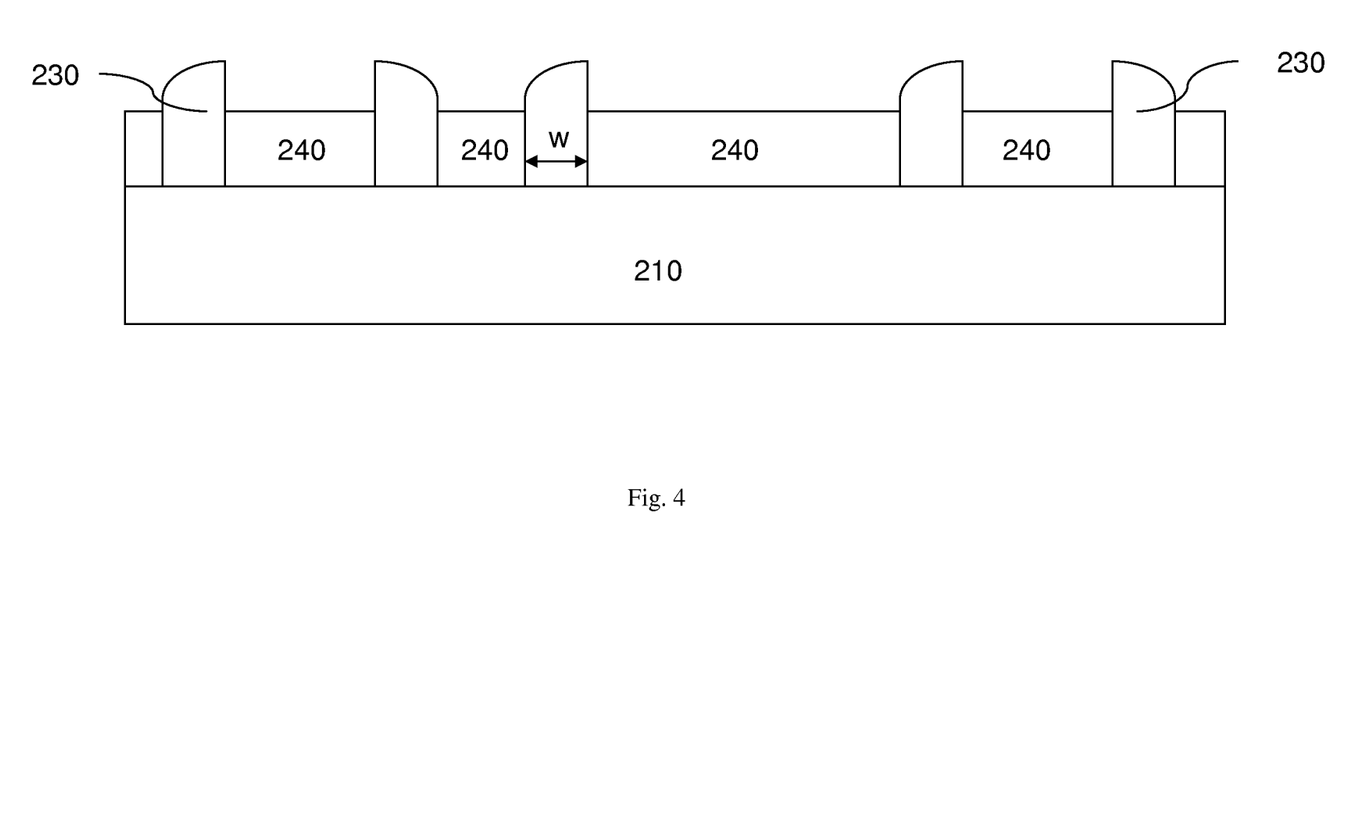

The method 100 proceeds to step 108 by depositing a second hard mask 240 over the main layer 210 between the sidewall spacers 230. The deposition process is designed to keep the top portion of the sidewall spacer 230 exposed, as shown in FIG. 4. The second hard mask 240 may include $SiO_2$, $Si_3N_4$, silicon carbide (SiC), or SiON. Alternatively, the second hard mask 240 may include polysilicon, photo resist, polymer, bottom anti-reflect coating (BARC), metals and other proper materials. In the present embodiment, the material of the second hard mask 240 is chosen to withstand a subsequent etching process to remove the sidewall spacer 230. The deposition of the second hard mask 240 is performed by techniques, such as CVD, PVD, spin-coating, epitaxially growth, thermal growth or other appropriated deposition techniques.

In order to expose the top portion of the sidewall spacer 230, the deposition process may be a selective depositing process with a proper thickness target. In the selective deposition process, the second hard mask 240 is formed at the main layer 210 between the sidewall spacer 230 but is not formed on the sidewall spacer 230. And the thickness of the second hard mask 240 is controlled to ensure the top portion of the sidewall spacer 230 remain being exposed. Alternatively, a non-selective deposition process may be performed, such as a spin-coating process. As an example, with a proper thickness target of the spin-coating process, the top portion of the sidewall spacer 230 may remain being exposed. In the spin-coating process, the thickness of the spin-coating material may be controlled by several factors, such as spin-on material type and the spin speed.

Further alternatively, a non-selective and non-spin-coating deposition process may be performed to deposit the second hard mask 240 over the main layer 210 and the sidewall spacer 230. A etch back process may be implied to remove excessive the second hard mask 240 and expose the top portion of the sidewall spacer 230. As an example, a chemical mechanical polishing (CMP) process is performed to remove a portion of the second hard mask 240 such that the sidewall spacer 230 is exposed. In the depicted embodiment, the second hard mask 240 includes polysilicon, amorphous-Si, or a refractory metal formed by a deposition technique, such as CVD or PVD. An etch-back or a CMP process may be performed thereafter to keep the top portion of the sidewall spacer 230 being exposed.

Figure 5:
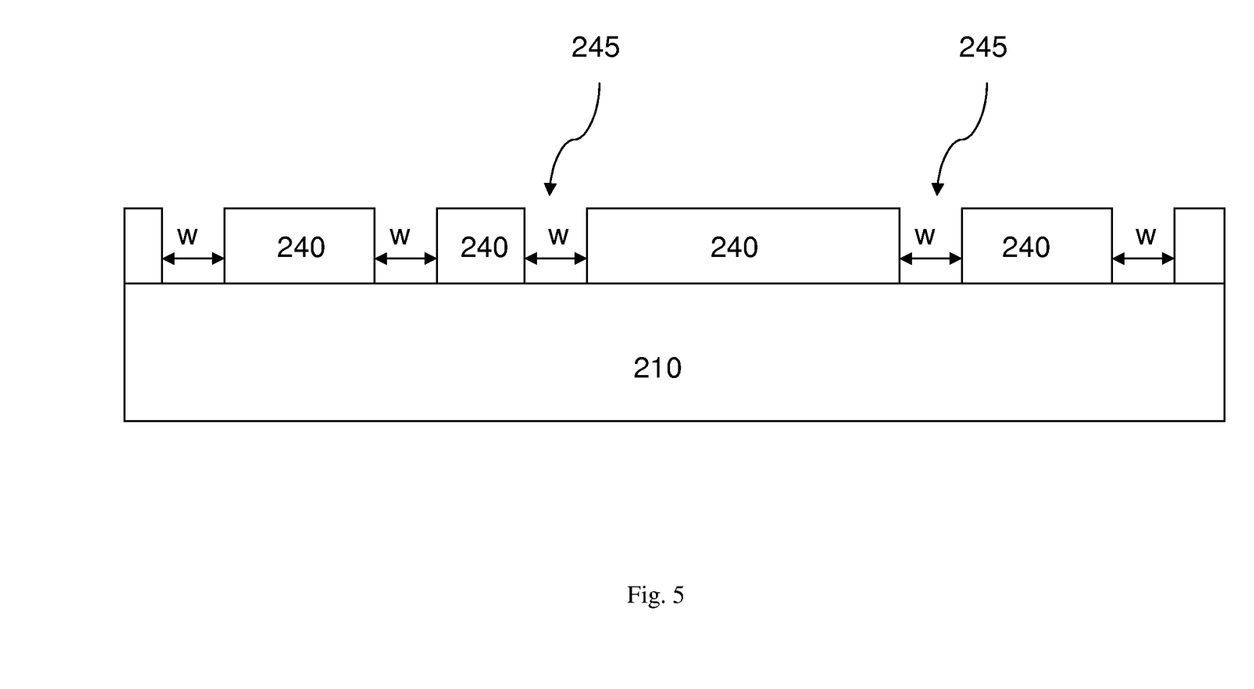

The method 100 proceeds to step 110 by removing the sidewall spacer 230 and forming an opening 245, as shown in FIG. 5. The sidewall spacer 230 may be removed by dry etch, wet etch, or a combination of dry and wet etch, in a conventional manner. An adequate etch selectivity of the removing process minimizes loss of the sidewall of the second hard mask 240. It results in a relatively vertical profile for the opening 245 with a fairly same width (w) as the removed sidewall spacer 230. The width (w) of the opening 245 is used to define the CD of the target feature 255 (not shown) in a subsequent etching process. In the depicted embodiment, the sidewall spacer 230 is removed by a plasma etch containing $CF_4$ and $CH_2F_2$ gases.

Figure 6:
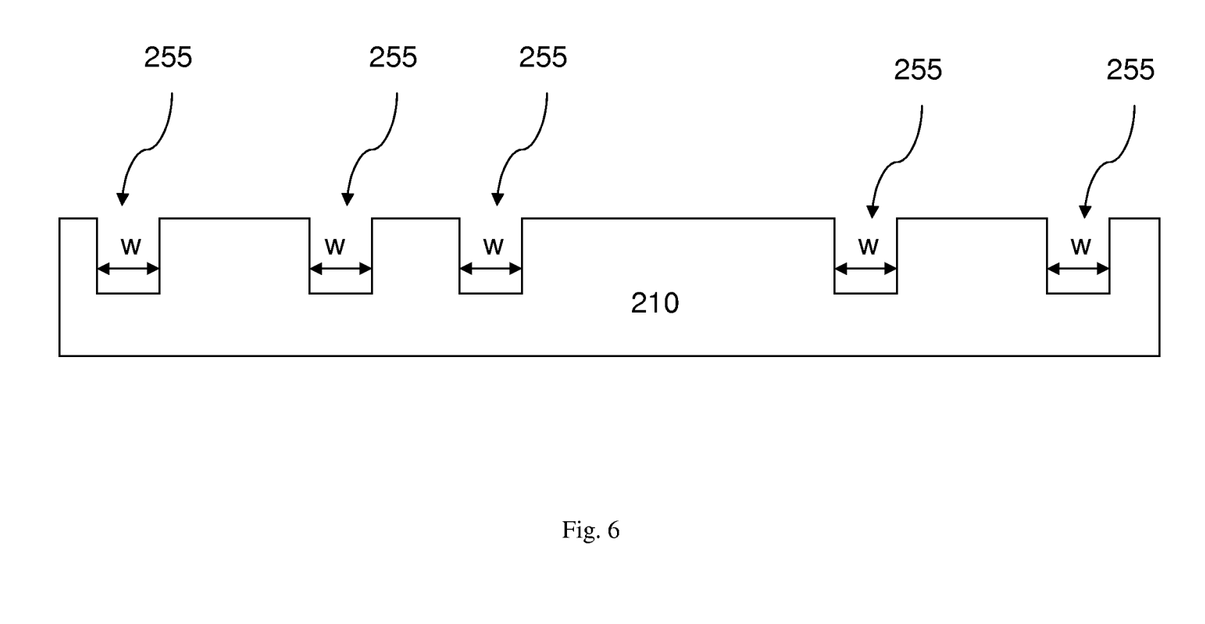

The method 100 proceeds to step 112 by etching the main layer 210 through the opening 245 on the second hard mask 240 and forming a target feature 255, as shown in FIG. 6. The etching process includes an anisotropic etch and form a relatively vertical profile with a fairly same width (w) as the opening 245. The CD of the target feature 215 may be defined by w. The second hard mask 240 is stripped thereafter. Both etching and stripping processes are applied by known deposition and etching techniques. In the depicted embodiment, the main layer 210 is etched by a plasma etch containing $CF_4$, $C_4F_8$ and $N_2O_2$ gases.

Figure 7:
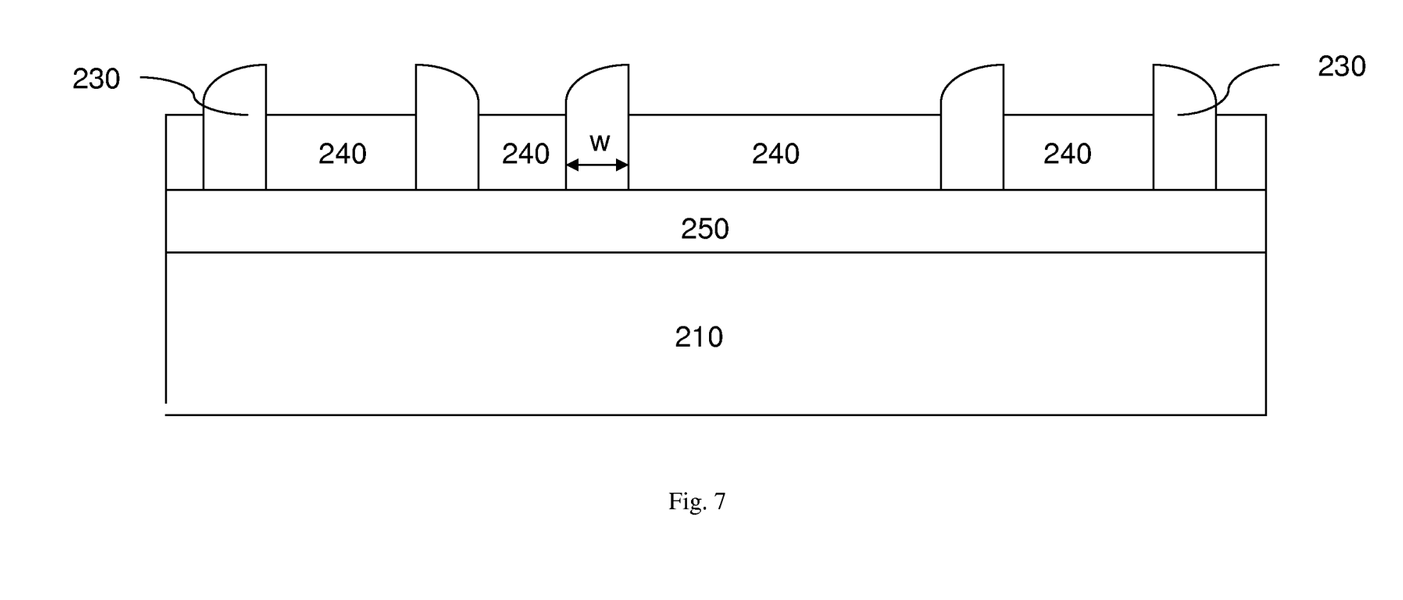
FIGS. 7 and 8 are cross-sectional views of another example embodiment of method of the inverse spacer lithography at fabrication stages constructed according to various aspects of the present disclosure.

In another embodiment of the present invention, a dummy (sacrificial) layer 250 is imposed between the main layer 210 and the first hard mask layer 220. The dummy layer 250 may shield the main layer 210 during etching processes of the first hard mask 220 etching and the sidewall spacer 230 etching, as shown in FIG. 7. With the dummy layer 250 covering the main layer 210, etching of the first hard mask 220 and the sidewall spacer 230 may stop or slow down on the dummy layer 250. It may minimize etching damage and thickness loss of the main layer 210 during the etching processes. The dummy layer 250 may include $SiO_2$, $Si_3N_4$, silicon carbide (SiC), SiON, polysilicon, refractory metal or other proper materials. The material of the dummy layer 250 is chosen to be able to withstand etching processes of the first hard mask 220 etching and the sidewall spacer 230 etching. The dummy layer 250 may be deposited by techniques such as CVD, PVD, spin-coating, epitaxially growth or any proper method. In the depicted embodiment, the dummy layer 250 includes $Si_3N_4$ formed by CVD technique.

The dummy layer 250 remains as a cover layer on top of the main layer 210 during formations of the sidewall spacer 230 and the second hard mask 240. Both of formations have been described above with reference to FIG. 2.

Figure 8:
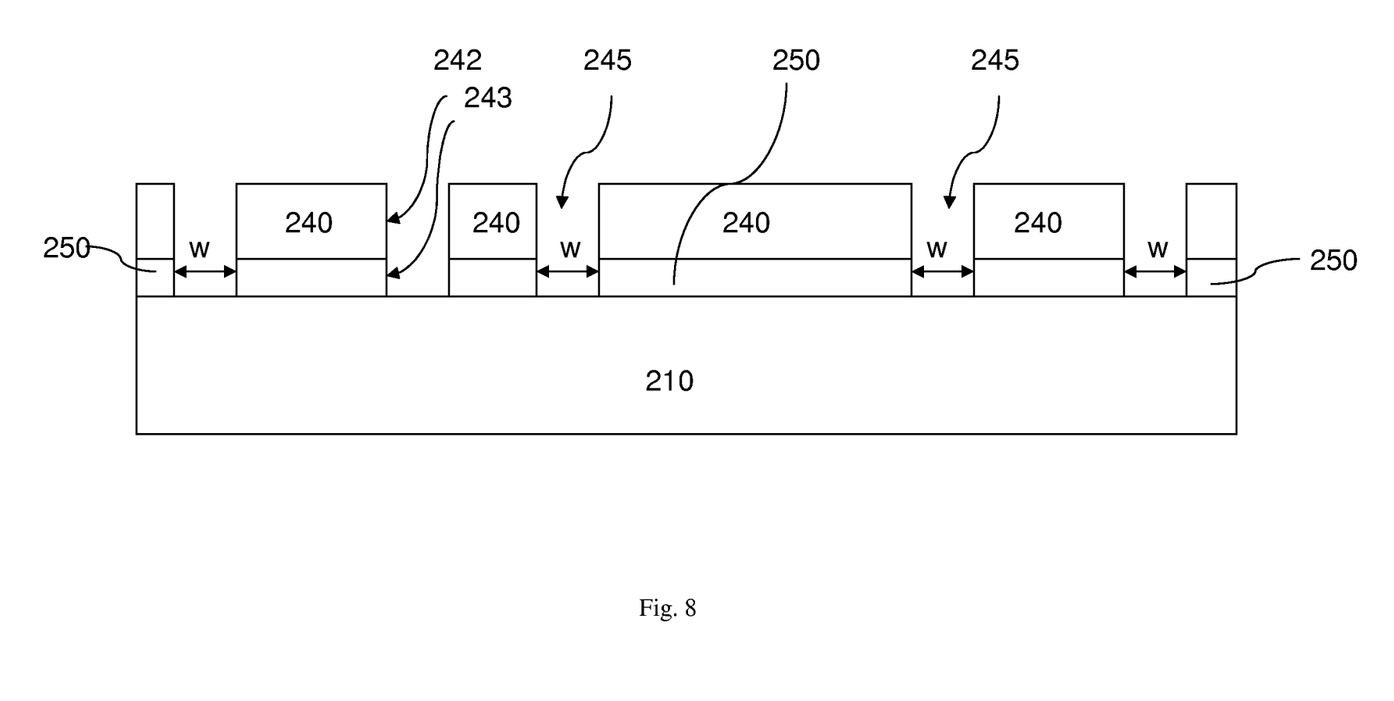

The dummy layer 250 is etched through the opening 245 formed by removing the sidewall spacer 230. The dummy layer 250 may be etched by extending the sidewall spacer 230 removing process or by adding another different etching step after the sidewall spacer 230 being removed. In the present embodiment, the sidewall spacer 230 is removed to form the upper portion 242 of the opening 245, which has been described above with reference to FIG. 5. The dummy layer 250 is etched to form the lower portion 243 of the opening 245. The etching process of the dummy layer 250 includes an anisotropic etch and form the lower portion 243 of the opening 245 with a relatively vertical profile aligning with the upper portion 242 of the opening 245, as shown in FIG. 8. The width of the opening 245 is fairly same as the width (w) of the sidewall spacer 230. Both the second hard mask 240 and the dummy layer 250 serve as an etch mask in a subsequent etching process, as shown in FIG. 9.

Figure 9:
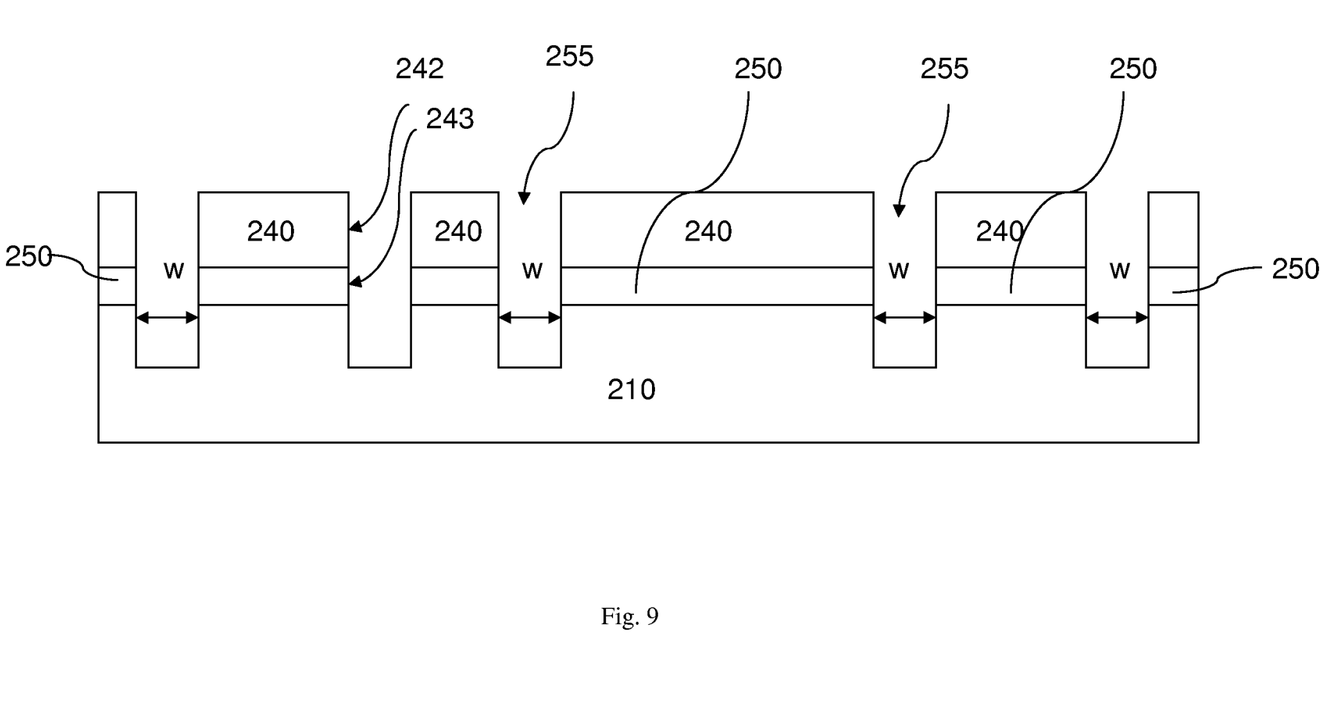
FIGS. 9 and 10 are cross-sectional views of yet another example embodiment of method of the inverse spacer lithography at fabrication stages constructed according to various aspects of the present disclosure.

Continuing with FIG. 9, the main layer 210 is etched through the opening 245 on the second hard mask 240 and the dummy layer 250. The etching process includes an anisotropic etching and results in forming the target feature 255 with a CD fairly same as the width (w). The target feature 255 may include slot contact, slot via, or metal damascene feature. Both the second hard mask 240 and the dummy layer 250 are stripped by an etching process, in a conventional manner.

Figure 10:
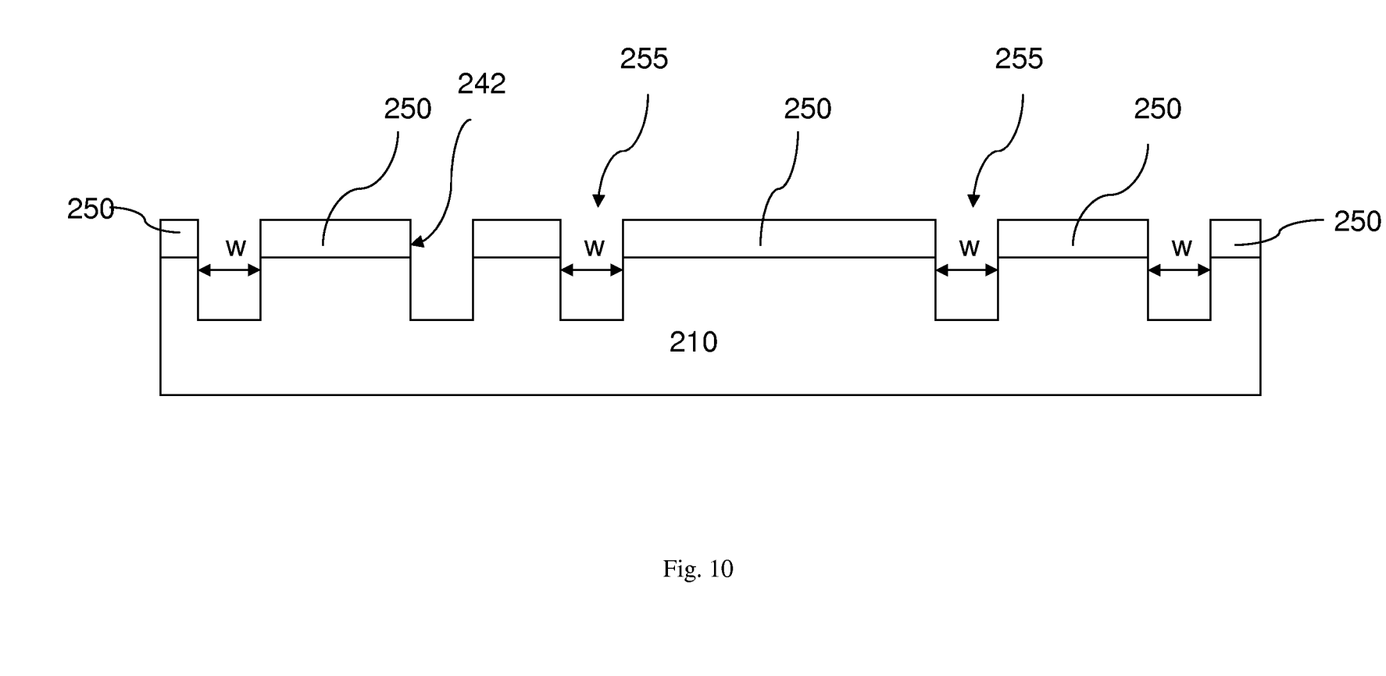

Yet in another embodiment of the present invention, the opening 245 is formed with an upper portion 242 and a lower portion 243 by fairly similar to the processes described above with reference to FIG. 8. The upper portion 242 is stripped by a proper etching process, in a conventional manner. The main layer 210 is etched through the remaining lower portion 243 of the opening 245 to form the target feature 255. The etching process includes an anisotropic etch and the target 255 is formed with a CD fairly same as the width (w) of the sidewall spacer, as shown in FIG. 10. The dummy layer 250 is stripped after the main layer etching. The etching process of the main layer 210 and the stripping process of the dummy layer 250 are fairly similar to the process described above with reference to FIG. 9. In the present embodiment, with a shallower opening 245 (the remaining lower portion of the opening 245), it may provide a larger process control window for etch profile and the target feature CD.

The present embodiments discussed above provide many benefits, it being understood that the benefits are not required for practicing the invention. The benefits of the embodiments discussed above include forming a target feature with a CD which may be beyond the patterning limitation of the existing lithography tools. The method demonstrates a capability to form target features, such as vias or trenches, with a CD range from 2 nm to 30 nm. The method demonstrates to achieve uniformly CD formation. The method also embeds a flexibility of forming non-pair features, such as line-end, line-turning features. The method provides a uniform pre-deposition condition and topography for a hard mask deposition process. With conventional deposition and etching processes, the method of inverse spacer lithography may extent the existing lithography tool to next technology generation with throughput advantage and cost efficiency.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a target feature of an integrated circuit, the method comprising:
   providing a main layer over a substrate;
   depositing a first mask layer on the main layer;
   patterning the first mask layer;
   forming sidewall spacers with a width (w) in adjoining sidewalls of the patterned first mask, wherein a top area of the patterned first mask layer is exposed;
   selectively removing the patterned first mask layer, thereby exposing a portion of the main layer between the sidewall spacers;
   selectively depositing a second hard mask layer over the main layer between the sidewall spacers such that a top portion of the sidewall spacers remains exposed;
   selectively removing the sidewall spacers to form an opening, thereby exposing another portion of the main layer in the opening; and
   etching the main layer through the opening to form the target feature.

2. The method of claim 1, wherein the main layer includes a low-k material deposited by a CVD technique.

3. The method of claim 1, wherein the first hard mask layer includes $SiO_2$, or $Si_3N_4$, deposited by a CVD technique.

4. The method of claim 1, wherein the first mask layer is etched anisotropically to have a vertical profile.

5. The method of claim 1, wherein the sidewall spacer includes Si3N4 or $SiO_2$, deposited by a CVD technique.

6. The method of claim 1, wherein the sidewall spacer is formed with the width (w) by controlling deposition thickness of the sidewall spacer.

7. The method of claim 6, wherein the width of the sidewall spacer is controlled from about 2 nm to about 30 nm.

8. The method of claim 1, further comprising:
   removing a predetermined sidewall spacer by a patterning technique after removing the first hard mask.

9. The method of claim 1, wherein the second hard mask includes polysilicon, or amorphous-Si deposited by a CVD technique.

10. The method of claim 1, wherein the second hard mask includes refractory metal formed by a PVD technique.

11. The method of claim 1, wherein a top portion of the sidewall spacers are exposed after the deposition of the second mask layer.

12. The method of claim 1, wherein a thickness of the second mask layer is controlled to not cover the top portion of sidewall spacer.

13. The method of claim 1, wherein removing excess the second mask layer by a CMP technique to expose the top portion of the sidewall spacer.

14. The method of claim 1, wherein selectively removing the sidewall spacers forms an opening with a width similar to the width (w) of the sidewall.

15. The method of claim 1, wherein the main layer is etched anisotropically through the opening to form the target feature with a CD having a width similar to the width of the sidewall spacer.

16. The method of claim 15, wherein the target feature is formed by etching the main layer anisotropically through the remaining lower portion of the opening with a CD similar to the width (w) of the sidewall spacer.

17. A method of making an integrated circuit, the method comprising:
   providing a main layer over a substrate;
   depositing a dummy layer over the main layer;
   depositing a first hard layer mask over the dummy layer;
   patterning the first hard mask layer;
   forming sidewall spacers with a width (w) on the patterned first hard mask layer;
   removing the patterned first hard mask layer;
   depositing a second hard mask layer between the sidewall spacers without depositing the second hard mask layer on a top portion of the sidewall spacers;
   removing the sidewall spacers to form an upper portion of an opening to expose the dummy layer;
   etching the dummy layer through the upper portion of the opening to form a lower portion of the opening, thereby exposing the main layer in the opening; and
   etching the main layer through the opening to form a target feature.

18. The method of claim 17, wherein the dummy layer includes $Si_3N_4$ or amorphous-Si, deposited by a CVD technique.

19. The method of claim 17, wherein the dummy layer includes refractory metal deposited by a PVD technique.

20. The method of claim 17, wherein the lower portion of the opening is formed with a vertical profile.

21. The method of claim 20, wherein the lower portion of the opening has a width similar to the width (w) of sidewall spacer.

22. A method of making an integrated circuit, the method comprising:
   providing a main layer over a substrate;
   depositing a dummy layer over the main layer;
   depositing a first hard layer mask over the dummy layer;
   patterning the first hard mask layer with a vertical profile;
   forming sidewall spacers with a width (w) on the patterned first hard mask layer;
   removing the patterned first hard mask layer;
   depositing a second hard mask layer between the sidewall spacers without depositing the second hard mask layer on a top portion of the sidewall spacers;
   removing the sidewall spacers to form an opening that exposes a top surface of the dummy layer;
   etching the exposed top surface of the dummy layer through the opening to expose a top surface of the main layer;
   removing the second hard mask layer; and
   etching the exposed top surface of the main layer through the opening to form a target feature with a critical dimension (CD) similar to the width of the sidewall spacer.

* * * * *